(12) United States Patent
Koizumi

(10) Patent No.: US 10,630,929 B2
(45) Date of Patent: Apr. 21, 2020

(54) SOLID-STATE IMAGING DEVICE AND SIGNAL PROCESSING DEVICE

(71) Applicant: CANON KABUSHIKI KAISHA, Tokyo (JP)

(72) Inventor: Satoshi Koizumi, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/199,926

(22) Filed: Nov. 26, 2018

(65) Prior Publication Data

US 2019/0174085 A1 Jun. 6, 2019

(30) Foreign Application Priority Data

Dec. 1, 2017 (JP) .................................. 2017-231686

(51) Int. Cl.
*H04N 5/378* (2011.01)
*H01L 27/146* (2006.01)
*H04N 5/3745* (2011.01)
*H04N 5/369* (2011.01)

(52) U.S. Cl.
CPC ....... *H04N 5/378* (2013.01); *H01L 27/14625* (2013.01); *H01L 27/14627* (2013.01); *H01L 27/14641* (2013.01); *H01L 27/14643* (2013.01); *H04N 5/36961* (2018.08); *H04N 5/37457* (2013.01)

(58) Field of Classification Search
CPC ............... H04N 5/378; H04N 5/36961; H04N 5/37457; H01L 27/14643; H01L 27/14625; H01L 27/14627; H01L 27/14641

USPC ....................................................... 250/208.1
See application file for complete search history.

(56) References Cited

U.S. PATENT DOCUMENTS

| | | | |
|---|---|---|---|
| 9,438,839 B2 * | 9/2016 | Hiyama | ................ H04N 9/045 |
| 9,998,715 B2 | 6/2018 | Koizumi | |
| 10,154,221 B2 | 12/2018 | Ogino | |
| 10,177,192 B2 * | 1/2019 | Lee | ...................... H04N 5/3696 |
| 2018/0309946 A1 | 10/2018 | Ohya | |
| 2018/0316881 A1 | 11/2018 | Arishima | |

FOREIGN PATENT DOCUMENTS

| | | |
|---|---|---|
| JP | 2016-131346 | 7/2016 |
| JP | 2017-69724 | 4/2017 |
| WO | 2013/128581 | 9/2013 |

* cited by examiner

*Primary Examiner* — Seung C Sohn
(74) *Attorney, Agent, or Firm* — Venable LLP

(57) ABSTRACT

A solid-state imaging device includes pixels in a matrix and a readout circuit that reads signals from a pixel. Each pixel includes a first photoelectric converter, a second photoelectric converter arranged in a first direction relative to the first photoelectric converter, a third photoelectric converter arranged in a second direction relative to the first photoelectric converter, a fourth photoelectric converter arranged in the second direction relative to the second photoelectric converter and in the first direction relative to the third photoelectric converter, and a micro lens for all the photoelectric converters. The readout circuit reads charges from all the photoelectric converters by three readout operations and reads signals so as to be able to identify a signal based on charges generated by only one photoelectric converter. The readout circuit selects the one photoelectric converter from all the photoelectric converters.

18 Claims, 9 Drawing Sheets

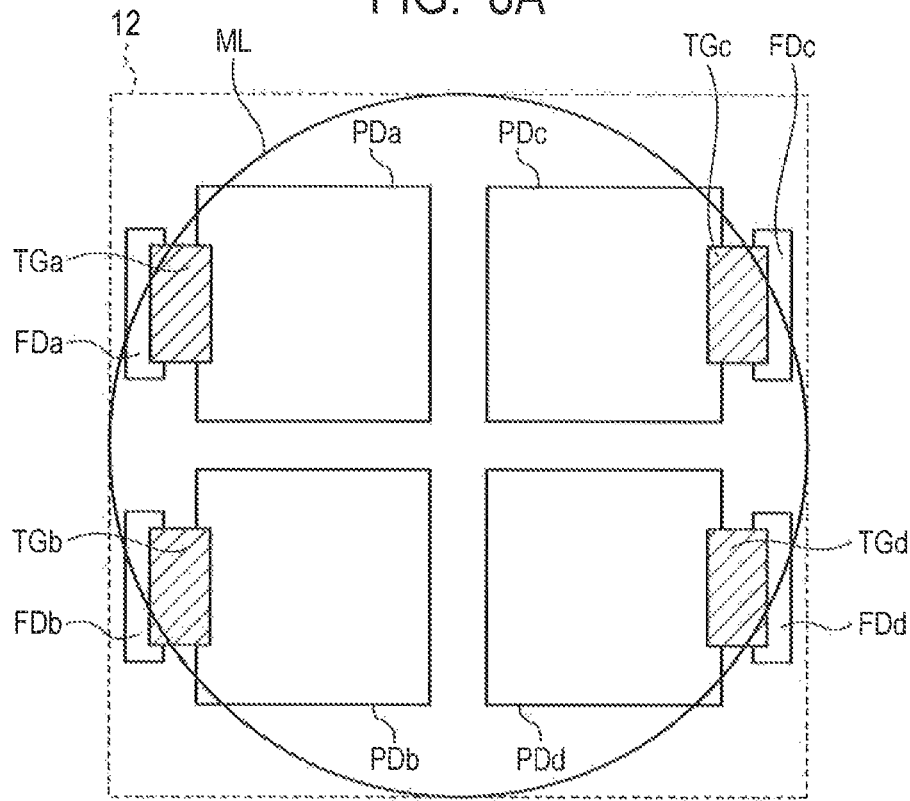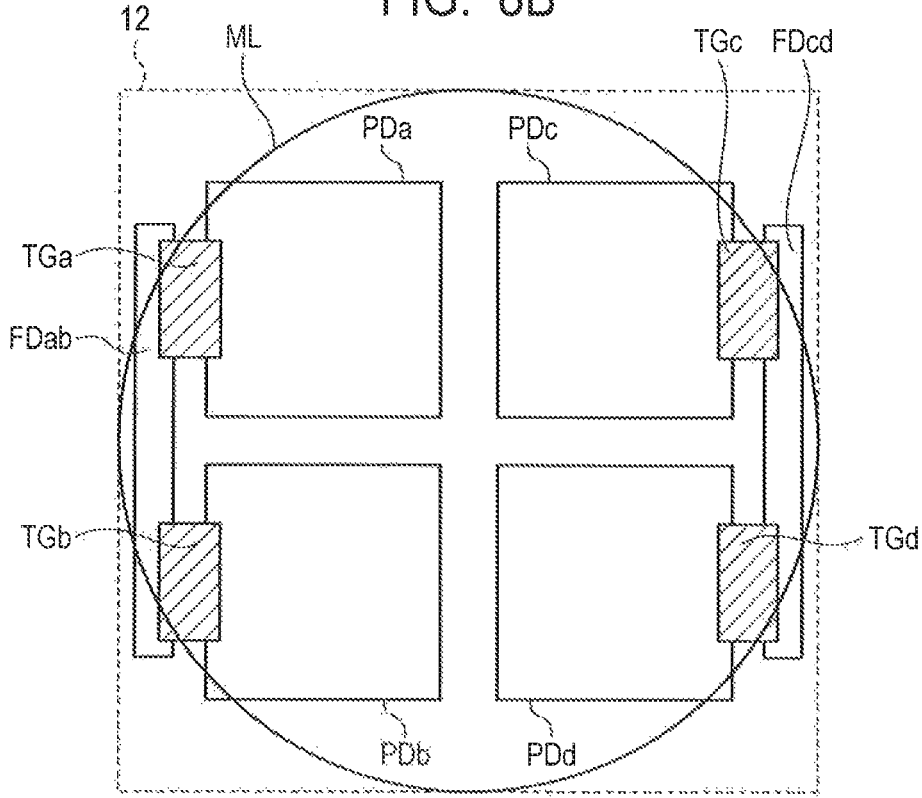

SOLID-STATE IMAGING DEVICE AND SIGNAL PROCESSING DEVICE

BACKGROUND OF THE INVENTION

Field of the Invention

The present invention relates to a solid-state imaging device and a signal processing device.

Description of the Related Art

In imaging systems such as a video camera or an electronic still camera, an autofocus (AF) function of automatically adjusting focus (focal point, focal spot) at the time of capturing has been widely used. As an imaging device having the AF function, an imaging device that can acquire both an imaging signal and a focus detection signal is known. International Publication No. WO2013/128581 discloses an imaging device that implements cross-ranging by selecting vertical line detection or horizontal line direction on a row-by-row basis.

In the method of selecting vertical line detection or horizontal line detection on a row-by-row basis as disclosed in the imaging device disclosed in International Publication No. WO2013/128581, however, the spatial resolution of phase difference information decreases, and accuracy in focus position adjustment may decrease.

SUMMARY OF THE INVENTION

The present invention intends to provide a solid-state imaging device and a signal processing device that may improve the spatial resolution of phase difference information used for focus detection.

According to an aspect of the present invention, there is provided a solid-state imaging device including a plurality of pixels arranged to form a plurality of rows and a plurality of columns, and a readout circuit that reads out signals from an associated pixel of the plurality of pixels, wherein each of the plurality of pixels includes a first photoelectric converter, a second photoelectric converter arranged in a first direction with respect to the first photoelectric converter, a third photoelectric converter arranged in a second direction intersecting with the first direction with respect to the first photoelectric converter, a fourth photoelectric converter arranged in the second direction with respect to the second photoelectric converter and in the first direction with respect to the third photoelectric converter, and a single micro lens that converges light to the first to fourth photoelectric converters, wherein the readout circuit is configured to read out a plurality of signals from the associated pixel by three times of readout operations, within the three times of readout operations, charges from all of the first to fourth photoelectric converters of the associated pixel are read out so that the charges of each of the first to fourth photoelectric converters are reflected to at least one of the plurality of signals, the readout circuit is configured to read out the plurality of signals from the associated pixel so as to be able to identify a signal based on charges generated by only one photoelectric converter out of the first to fourth photoelectric converters of the associated pixel, and the readout circuit is configured to select the one photoelectric converter of the associated pixel out of the first to fourth photoelectric converters.

Further, according to another aspect of the present invention, there is provided a signal processing device that processes signals output from a solid-state imaging device that comprises includes a plurality of pixels arranged to form a plurality of rows and a plurality of columns, wherein each of the plurality of pixels has includes a plurality of photoelectric conversion units converters, which include three or more photoelectric conversion units converters, and a single micro lens that converges light to the plurality of photoelectric conversion units converters, the signal processing device including a phase difference calculation unit that calculates a phase difference in a first direction based on a pair of first phase difference detection signals including phase difference information in the first direction and calculates a phase difference in a second direction based on a pair of second phase difference detection signals including phase difference information in the second direction, the second direction intersecting with the first direction, wherein each of the pair of first phase difference detection signals is a signal based on charges generated by only one photoelectric conversion unit converter of the plurality of photoelectric conversion units converters, and wherein each of the pair of second phase difference detection signals is a signal based on charges generated by two or more photoelectric conversion units converters of the plurality of photoelectric conversion units converters.

Further features of the present invention will become apparent from the following description of exemplary embodiments with reference to the attached drawings.

BRIEF DESCRIPTION OF THE DRAWINGS

FIG. 8A and FIG. 8B are schematic diagrams illustrating a plan layout of a pixel of a solid-state imaging device according to a third embodiment of the present invention.

DESCRIPTION OF THE EMBODIMENTS

First Embodiment

A solid-state imaging device and a method of driving the same according to a first embodiment of the present invention will be described with reference to FIG. 1 to FIG. 7B.

Figure 1:
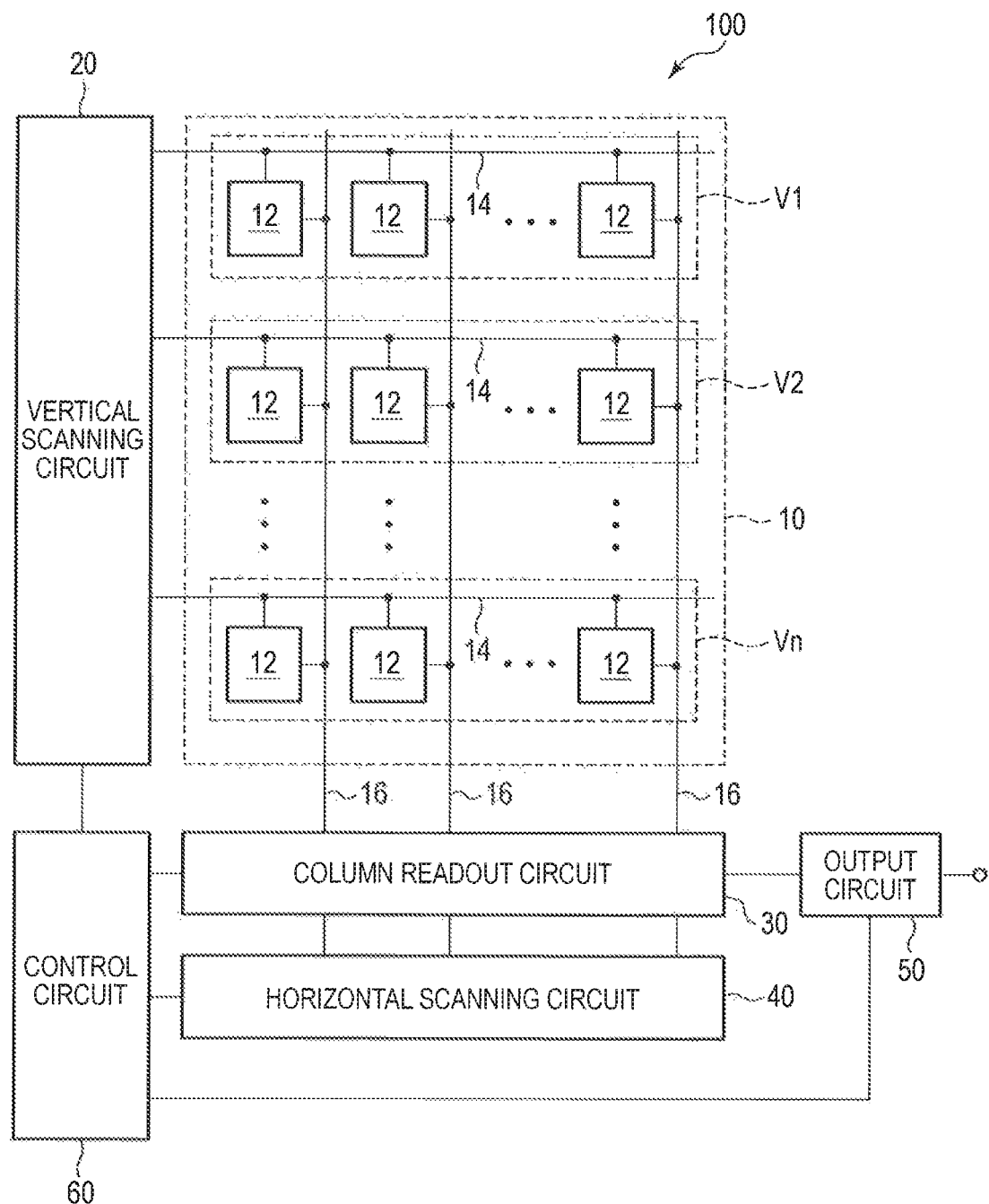
FIG. 1 is a block diagram illustrating a general configuration of a solid-state imaging device according to a first embodiment of the present invention.
Figure 2:
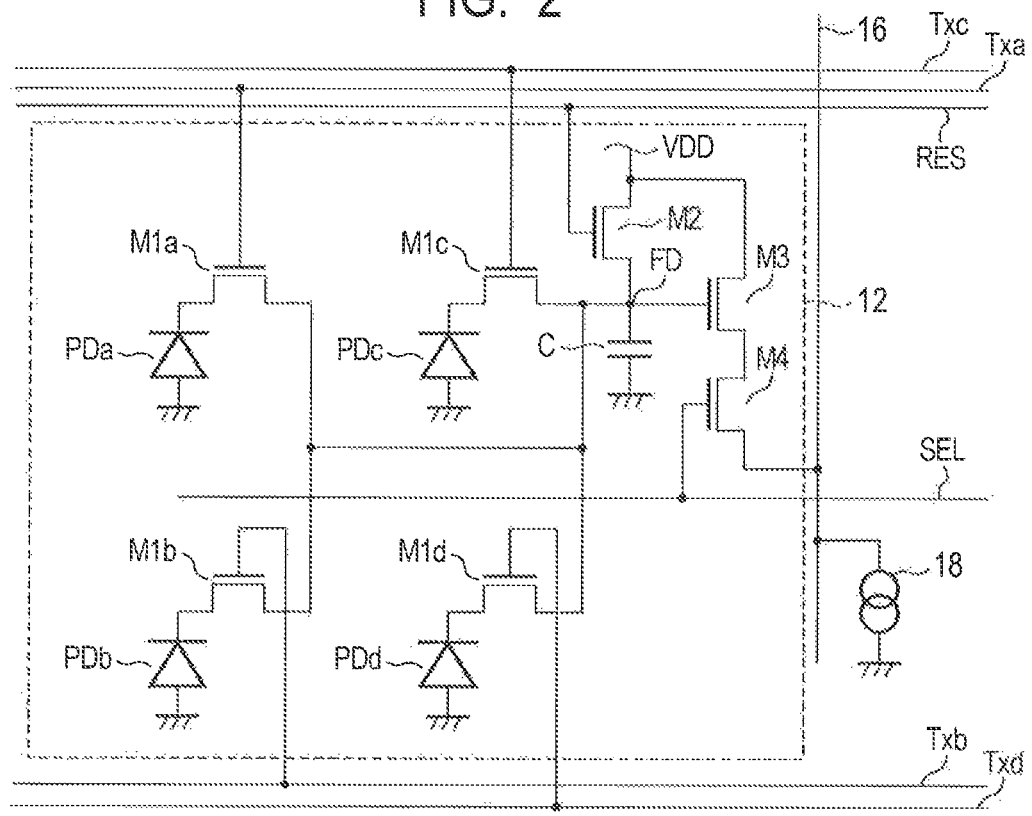
FIG. 2 is a circuit diagram illustrating a configuration example of a pixel of the solid-state imaging device according to the first embodiment of the present invention.
Figure 3:
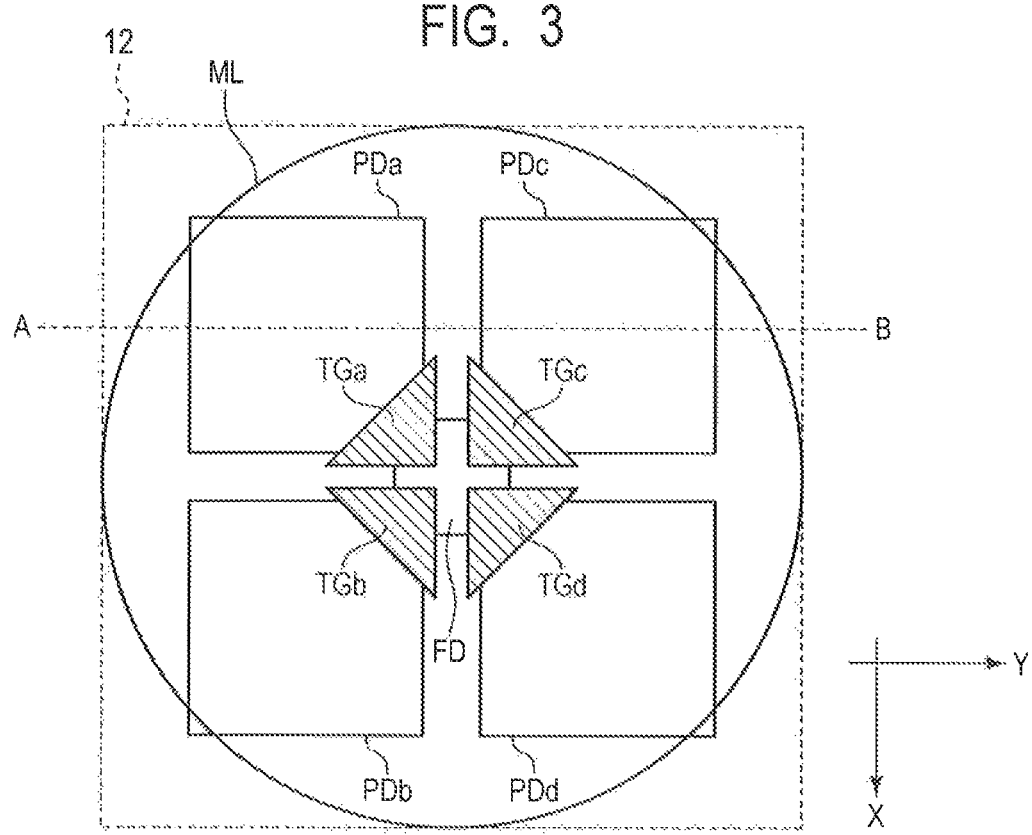
FIG. 3 is a schematic diagram illustrating an example of a plan layout of a pixel of the solid-state imaging device according to the first embodiment of the present invention.

First, the structure of the solid-state imaging device according to the present embodiment will be described by using FIG. 1 to FIG. 3. FIG. 1 is a block diagram illustrating a general configuration of the solid-state imaging device according to present embodiment. FIG. 2 is a circuit diagram illustrating a configuration example of a pixel of the solid-state imaging device according to the present embodiment. FIG. 3 is a schematic diagram illustrating an example of a plan layout of a pixel of the solid-state imaging device according to the present embodiment.

As illustrated in FIG. 1, a solid-state imaging device 100 according to the present embodiment includes a pixel region 10, a vertical scanning circuit 20, a column readout circuit 30, a horizontal scanning circuit 40, an output circuit 50, and a control circuit 60.

In the pixel region 10, a plurality of pixels 12 are provided in a matrix over a plurality of rows and a plurality of columns. FIG. 1 illustrates the pixel region 10 including n pixel rows from pixel row V1 to pixel row Vn. Each of the pixel rows includes a plurality of pixels 12 aligned in a row in the row direction. The number of rows and the number of columns in a pixel array arranged in the pixel region 50 are not particularly limited. Further, in addition to the pixels 12 that detect imaging signals or focus detection signals, other pixels (not illustrated) such as an optical black pixel that is shielded from light or a dummy pixel that outputs no signal may be arranged in the pixel region 10.

On each pixel row of the pixel array in the pixel region 10, a control line 14 is arranged extending in a first direction (the lateral direction in FIG. 1, the horizontal direction in an example). The control line 14 is connected to the pixels 12 aligned in the first direction, respectively, to form a signal line common to these pixels 12. The first direction in which the control line 14 extends may be referred to as a row direction in the present specification. Further, on each column of the pixel array in the pixel region 10, an output line 16 is arranged extending in a second direction intersecting with the first direction (the perpendicular direction in FIG. 1, the vertical direction in an example). The output line 16 is connected to the pixels 12 aligned in the second direction, respectively, to form a signal line common to these pixels 12. The second direction in which the output line 16 extends may be referred to as a column direction in the present specification.

The control line 14 on each pixel row is connected to the vertical scanning circuit 20. The vertical scanning circuit 20 is a circuit unit that supplies, to the pixels 12 via the control lines 14, control signals used for driving readout circuits within the pixels 12 when reading out pixel signals from the pixels 12. One end of the output line 16 on each column is connected to the column readout circuit 30. Pixel signals read out from the pixels 12 are input to the column readout circuit 30 via the output lines 16. The column readout circuit 30 is a circuit unit that performs a predetermined signal processing, for example, signal processing such as an amplification process, an analog-to-digital (AD) conversion process, or the like on the pixel signals read out from the pixels 12. The column readout circuit 30 may include differential amplifier circuits, sample and hold circuits, AD conversion circuits, or the like.

The horizontal scanning circuit 40 is a circuit unit that supplies, to the column readout circuit 30, control signals used for transferring pixel signals processed by the column readout circuit 30 to the output circuit 50 sequentially on a column-by-column basis. The output circuit 50 is a circuit unit that is formed of a buffer amplifier, a differential amplifier circuit, or the like and outputs pixel signals read out from the column readout circuit 30 to a signal processing unit outside the solid-state imaging device 100. The control circuit 60 is a circuit unit that supplies control signals used for controlling operations and the timing thereof of the vertical scanning circuit 20, the column readout circuit 30, the horizontal scanning circuit 40, and the output circuit 50. At least some of the control signals supplied by the control circuit 60 to control the operations and the timing thereof of the vertical scanning circuit 20, the column readout circuit 30, the horizontal scanning circuit 40, and the output circuit 50 may be supplied from the outside from the solid-state imaging device 100.

Each of the pixels 12 may be formed of a circuit illustrated in FIG. 2, for example. The pixel 12 illustrated in FIG. 2 includes photoelectric converters PDa, PDb, PDc, and PDd, transfer transistors M1a, M1b, M1c, and M1d, a reset transistor M2, an amplifier transistor M3, and a select transistor M4.

The photoelectric converters PDa, PDb, PDc, and PDd are each a photodiode, for example. The anode of the photoelectric converter PDa is connected to a reference voltage node, and the cathode is connected to the source of the transfer transistor M1a. The anode of the photoelectric converter PDb is connected to the reference voltage node, and the cathode is connected to the source of the transfer transistor M1b. The anode of the photoelectric converter PDc is connected to the reference voltage node, and the cathode is connected to the source of the transfer transistor M1c. The anode of the photoelectric converter PDd is connected to the reference voltage node, and the cathode is connected to the source of the transfer transistor M1d.

The drains of the transfer transistors M1a, M1b, M1c, and M1d are connected to the source of the reset transistor M2 and the gate of the amplifier transistor M3. The connection node of the drains of the transfer transistors M1a, M1b, M1c, and M1d, the source of the reset transistor M2, and the gate of the amplifier transistor M3 is a so-called floating diffusion FD. The capacitance component (capacitor C) of the floating diffusion FD functions as a holding portion of charges transferred from the photoelectric converters PDa, PDb, PDc, and PDd and functions as a charge-to-voltage converter.

The drain of the reset transistor M2 and the drain of the amplifier transistor M3 are connected to a power supply node (voltage VDD). The source of the amplifier transistor M3 is connected to the drain of the select transistor M4. The source of the select transistor M4 is connected to the output line 16. The current source 18 is connected to the output line 16.

In a case of the pixel 12 illustrated in FIG. 2, the control line 14 arranged on each pixel row includes transfer gate signal lines Txa, Txb, Txc, and Txd, a reset signal line RES, and a select signal line SEL. The transfer gate signal line Txa is connected to the gate of the transfer transistor M1a of each pixel 12 belonging to the corresponding pixel row. The transfer gate signal line Txb is connected to tire gate of the transfer transistor M1b of each pixel 12 belonging to the corresponding pixel row. The transfer gale signal line Txc is connected to the gate of the transfer transistor M1c of each pixel 12 belonging to the corresponding pixel row. The transfer gate signal line Txd is connected to the gate of the transfer transistor M1d of each pixel 12 belonging to the corresponding pixel row. The reset signal line RES is connected to the gate of the reset transistor M2 of each pixel 12 belonging to the corresponding pixel row. The select signal line SEL is connected to the gate of the select transistor M4 of each pixel 12 belonging to the corresponding pixel row.

Each of the photoelectric converters PDa, PDb, PDc, and PDd converts (photoelectrically converts) an incident light into an amount of charges in accordance with the light amount and accumulates the generated charges. When turned on, the transfer transistor M1a transfers charges of the photoelectric converter PDa to the floating diffusion FD. When turned on, the transfer transistor M1b transfers charges of the photoelectric converter PDb to the floating diffusion FD. When turned on, the transfer transistor M1c transfers charges of the photoelectric converter PDc to the floating diffusion FD. When turned on, the transfer transistor M1d transfers charges of the photoelectric converter PDd to the floating diffusion FD. The transfer transistors M1a, M1b, M1c, and M1d form a charge transfer unit that transfers charges of the photoelectric converters PDa, PDb, PDc, and PDd to the floating diffusion FD.

The floating diffusion FD has a voltage in accordance with the amount of charges transferred from the photoelectric converters PDa, PDb, PDc, and PDd due to charge-to-voltage conversion by the capacitance component (capacitor C). The amplifier transistor M3 is configured such that the voltage VDD is supplied to the drain and a bias current is supplied to the source from the current source 18 via the select transistor M4, which forms an amplifier unit (source follower circuit) whose gate is the input node. Thereby, the amplifier transistor M3 outputs a signal based on the voltage of the floating diffusion FD to the output line 16 via the select transistor M4. When turned on, the reset transistor M2 resets the floating diffusion FD to a voltage in accordance with the voltage VDD. At this time, by the transfer transistors M1a, M1b, M1c, and M1d being turned on, the photoelectric converters PDa, PDb, PDc, and PDd can be reset. The reset transistor M2, together with the transfer transistors M1a, M1b, M1c, and M1d, forms a reset unit that resets the photoelectric converters PDa, PDb, PDc, and PDd.

A common micro lens ML is arranged in the light incident direction of the four photoelectric converters PDa, PDb, PDc, and PDd of a single pixel 12. Thereby, lights that have passed through pupil regions having different exit pupils of an imaging optical system enter the photoelectric converters PDa, PDb, PDc, and PDd, respectively.

For example, in the configuration example illustrated in FIG. 3, the four photoelectric converters PDa, PDb, PDc, and PDd are arranged in a matrix of two rows by two columns, and a single common floating diffusion FD is arranged between the photoelectric converters PDa, PDb, PDc, and PDd. Gate electrodes TGa, TGb, TGc, and TGd of the transfer transistors M1a, M1b, M1c, and M1d are arranged between the floating diffusion FD and each of the photoelectric converters PDa, PDb, PDc, and PDd, respectively. A pair of the photoelectric converter PDa, and the photoelectric converter PDb and a pair of the photoelectric converter PDc and the photoelectric converter PDd are arranged adjacent to each other in the second direction (X-direction) in a planar view. Further, a pair of the photoelectric converter PDa and the photoelectric converter PDc and a pair of the photoelectric converter PDb and the photoelectric converter PDd are arranged adjacent to each other in the first direction (Y-direction) in a planar view.

A plurality of photoelectric converters PD sharing a single micro lens ML are arranged adjacent to each other in predetermined directions in such a way, and thereby a phase difference detection can be performed in the plurality of directions. Further, a plurality of photoelectric converters PD are arranged adjacent to each other in a plurality of directions, and thereby phase difference detection can be performed in each of the plurality of directions. Such a configuration enables phase difference detection in a direction of a higher contrast for each subject and can increase ranging accuracy for a greater number of subject patterns.

Next, before describing the operation of the solid-state imaging device according to the present embodiment, a readout method of a general solid-state imaging device expected from the pixel configuration illustrated in FIG. 2 will be described by using FIG. 4.

Figure 4:
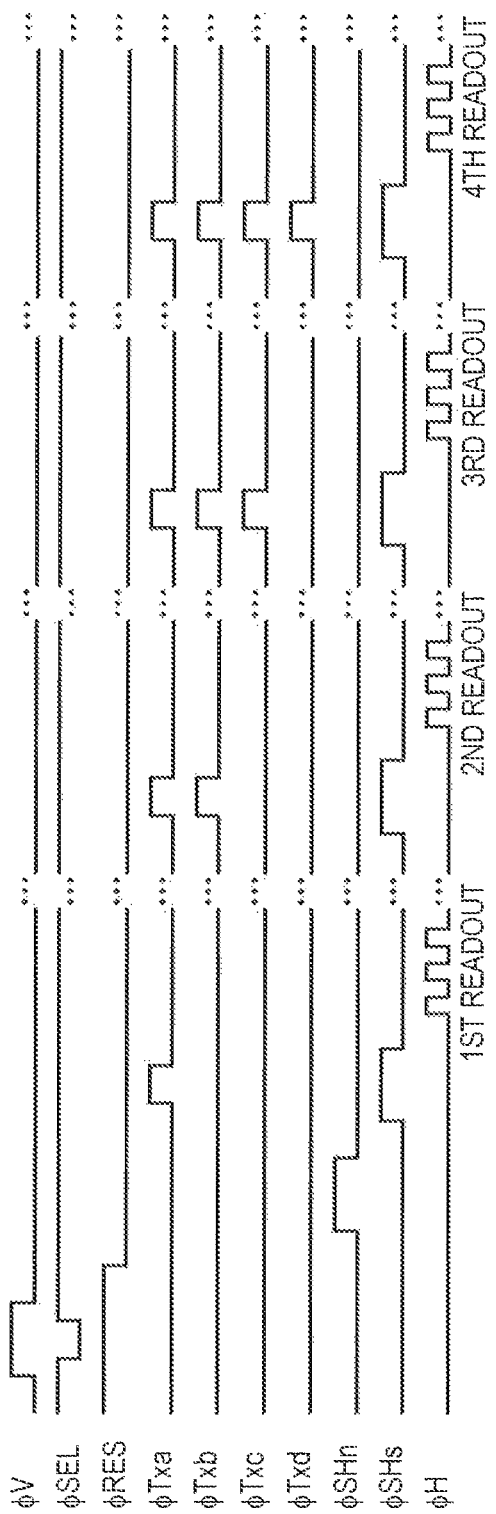
FIG. 4 is a timing diagram illustrating an example of a readout method of the solid-state imaging device.

FIG. 4 is a timing diagram illustrating an example of a readout method of a solid-state imaging device. In FIG. 4, a signal $\phi V$ is a vertical scanning signal. A control signal $\phi SEL$ is a drive pulse for the select transistor M4 supplied to the select signal line SEL. A control signal $\phi RES$ is a drive pulse for the reset transistor M2 supplied to the reset signal line RES. Control signals $\phi Txa$, $\phi Txb$, $\phi Txc$, and $\phi Txd$ are drive pulses for the transfer transistors M1a, M1b, M1c, and M1d supplied to transfer gate signal lines Txa, Txb, Txc, and Txd. The control signals $\phi SEL$, $\phi RES$, $\phi Txa$, $\phi Txb$, $\phi Txc$, and $\phi Txd$ are supplied to the control line 14 on a predetermined pixel row of pixel rows V1 to Vn which is selected by the vertical scanning circuit 20. The control signal $\phi SHn$ is a control signal for a switch that controls connection or disconnection of a sample and hold capacitor used for N-signal. The control signal $\phi SHs$ is a control signal for a switch that controls connection or disconnection of a sample and hold capacitor used for S-signal. A signal $\phi H$ is a horizontal transfer signal.

In the readout method for the solid-state imaging device illustrated in FIG. 4, first, the control signal $\phi SEL$ is controlled to a high level at a predetermined timing in accordance with the vertical scanning signal $\phi V$ to turn on the select transistor M4. At this time, the control signal $\phi RES$ is at a high level, and the floating diffusion FD is already reset. The control signal $\phi RES$ is controlled to a low level, then the control signal $\phi SHn$ is controlled to a high level, and thereby a reset signal (N-signal) output to the output line 16 via the select transistor M4 is held in the sample and hold capacitor used for N-signal.

Next, the control signal $\phi Txa$ is controlled to a high level, signal charges accumulated in the photoelectric converter PDa are transferred to the floating diffusion FD. At this time, the control signal $\phi SHs$ is controlled to a high level, and thereby an optical signal (S-signal) output to the output line 16 via the select transistor M4 is held in the sample and hold capacitor used for S-signal. In this example, a signal component based on a signal charges accumulated in the photoelectric converter PDa is referred to as an Sa-signal. Next, the horizontal transfer signal $\phi H$ is turned on sequentially on a column-by-column basis, and the Sa-signal and the N-signal held in the sample and hold capacitors are transferred to the output circuit 50. The difference of the Sa-signal and the N-signal ((Sa−N)-signal) is then calculated in the output circuit 50 to output a pixel signal having a good S/N ratio (first readout).

Next, the control signals $\phi Txa$ and $\phi Txb$ are controlled to a high level and signal charges accumulated in photoelectric converters PDa and PDb are transferred to the floating diffusion FD and added to signal charges held in the floating diffusion FD. At this time, the control signal $\phi SHs$ is controlled to a high level, and thereby an optical signal output to the output line 16 via the select transistor M4 (S-signal) is held in the sample and hold capacitor used for S-signal. A signal component based on signal charges accumulated in the photoelectric converter PDb is referred to as an Sb-signal, and an (Sa+Sb)-signal obtained by adding the Sa-signal and the Sb-signal is held in the sample and hold capacitor used for S-signal. Next, the horizontal transfer signal φH is turned on sequentially on a column-by-column basis, and the (Sa+Sb)-signal and the N-signal held in the sample and hold capacitor are transferred to the output circuit 50. The difference between the (Sa+Sb)-signal and the N-signal ((Sa+Sb−N)-signal) is then calculated in the output circuit 50 to output a pixel signal having a good S/N ratio (second readout).

Next, the control signals φTxa, φTxb, and φTxc are controlled to a high level, and signal charges accumulated in photoelectric converters PDa, PDb, and PDc are transferred to the floating diffusion FD and added to signal charges held in the floating diffusion FD. At this time, the control signal φSHs is controlled to a high level, and thereby an optical signal output to the output line 16 via the select transistor M4 (S-signal) is held in the sample and hold capacitor used for S-signal. A signal component based on signal charges accumulated in the photoelectric converter PDc is referred to as an Sc-signal, and an (Sa+Sb+Sc)-signal obtained by adding the Sa-signal and Sb-signal and the Sc-signal is held in the sample and hold capacitor used for S-signal. Next, the horizontal transfer signal φH is turned on sequentially on a column-by-column basis, and the (Sa+Sb+Sc)-signal and the M-signal held in the sample and hold capacitor are transferred to the output circuit 50. The difference between the (Sa+Sb+Sc)-signal and the N-signal ((Sa+Sb+Sc−N)-signal) is then calculated in the output circuit 50 to output a pixel signal having a good S/N ratio (third readout).

Next, the control signals φTxa, φTxb, φTxc, and φTxd are controlled to a high level, and signal charges accumulated in photoelectric converters PDa, PDb, PDc, and PDd are transferred to the floating diffusion FD and added to signal charges held in the floating diffusion FD. At this time, the control signal φSHs is controlled to a high level, and thereby an optical signal output to the output line 16 via the select transistor M4 (S-signal) is held in the sample and hold capacitor used for S-signal. A signal component based on signal charges accumulated in the photoelectric converter PDd is referred to as an Sd-signal, and an (Sa+Sb+Sc+Sd)-signal obtained by adding the Sa-signal, Sb-signal, and Sc-signal and the Sd-signal is held in the sample and hold capacitor used for S-signal. Next, the horizontal transfer signal φH is turned on sequentially on a column-by-column basis, and the (Sa+Sb+Sc+Sd)-signal and the N-signal held in the sample and hold capacitor are transferred to the output circuit 50. The difference between the (Sa+Sb+Sc+Sd)-signal and the N-signal ((Sa+Sb+Sc+Sd−N)-signal) is then calculated in the output circuit 50 to output a pixel signal having a good S/N ratio (fourth readout).

The (Sa+Sb+Sc+Sd−N)-signal obtained in such a way can be used as an imaging signal.

Further, the Sb-signal can be calculated from the difference between the (Sa+Sb−N)-signal and the (Sa−N)-signal. The Sc-signal can be calculated from the difference between the (Sa+Sb+Sc−N)-signal and the (Sa+Sb−N)-signal. The Sd-signal can be calculated from the difference between the (Sa+Sb+Sc+Sd−N)-signal and the (Sa+Sb+Sc−N)-signal. Therefore, information on the Sa-signal, the Sb-signal, the Sc-signal, and the Sd-signal can be obtained, respectively, and a phase shift in a plurality of directions can be calculated.

In the readout method for the solid-state imaging device according to the reference example, however, since it is necessary to perform four times in total of readout operations (first to fourth readout) within one frame, there is a problem that a series of readout operations takes time resulting in a reduction in framerate. Further, although International Publication No. WO2013/128581 addresses the problem of reduction in framerate by switching the phase difference detection direction between on even-numbered rows and on odd-numbered rows, since the phase difference detection information in the same direction occurs on every two rows, this causes a problem of a reduction in spatial resolution of ranging information.

In view of the above problems, the drive method of the solid-state imaging device according to the present embodiment is to achieve both prevention of reduction in framerate and prevention of reduction in spatial resolution of ranging information.

Figure 5:
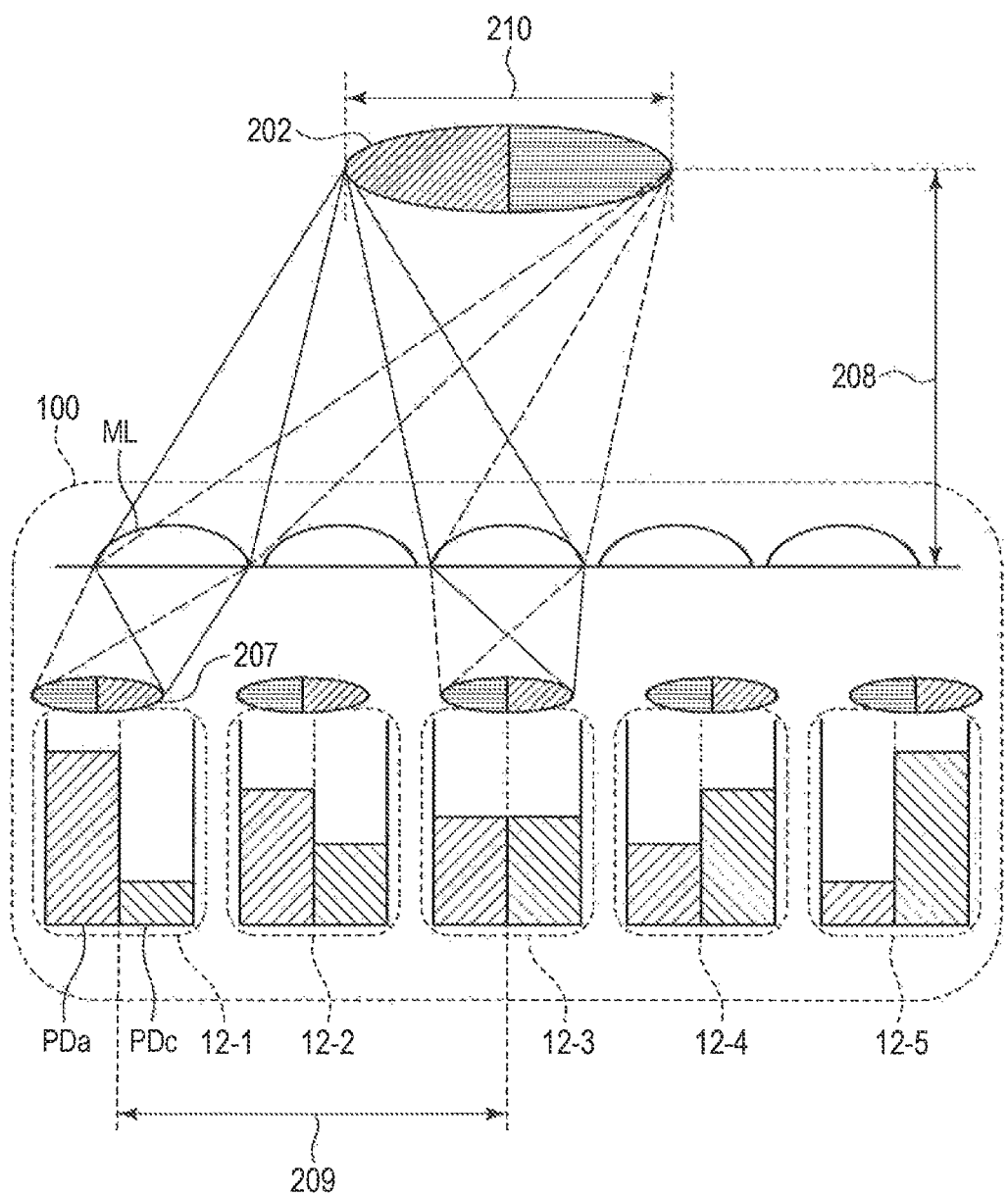
FIG. 5 is a schematic cross-sectional view illustrating an imaging unit including the solid-state imaging device according to the first embodiment of the present invention.

FIG. 5 is a schematic cross-sectional view illustrating an imaging unit including the solid-state imaging device 100 of the present embodiment. FIG. 5 illustrates only the photoelectric converters PDa and PDc of the plurality of photoelectric converters PDa, PDb, PDc, and PDd included in the pixel 12 assuming a cross section taken along the line A-B in FIG. 3.

A light that has passed through the exit pupil 202 of an image capturing lens enters the solid-state imaging device 100 arranged at a distance of an exit pupil distance 208 from the image capturing lens. The solid-state imaging device 100 includes a plurality of pixels 12, each of which includes the plurality of photoelectric converters PDa, PDb, PDc, and PDd and a single micro lens ML, as described above. Typically, while the size of the exit pupil 202 of an image capturing lens is millimeter order, the size of the pixel 12 is micrometer order. Because depiction with the actual proportion will make the illustration difficult, a part of the components of the solid state imaging device 100 is extracted and enlarged for the purpose of illustration. That is, in FIG. 5, a pixel 12-3 is an enlarged view of the center part where the image height is zero in the pixel 12, pixels 12-1 and 12-5 are enlarged views of positions where the left and right image heights are high, respectively, in the pixel 12, and pixels 12-2 and 12-4 are enlarged views of positions where the left and right image heights are medium, respectively, in the pixel 12.

The exit pupil 202 of the image capturing lens forms an exit pupil image 207 on the surface of the pixel 12 through the micro lens ML. At this time, the center of the exit pupil image 207 does not match the center of the pixel 12, in particular, at a position where the image height is high except for a case where the exit pupil distance 208 and the pitch of the micro lens ML satisfy a particular condition. Thus, a difference in an incident light amount, that is, a sensitivity difference occurs among the plurality of photoelectric converters PDa, PDb, PDc, and PDd included in a single pixel 12. Note that the particular condition relates to the relationship of the exit pupil distance 208 and the pitch of the micro lens ML when the center of the exit pupil image 207 matches the center of the pixel 12 in all the pixels 12.

In FIG. 5, the area of the hatched parts depicted in the photoelectric converters PDa and PDc corresponds to the sensitivity determined by the amount of signal charges accumulated in respective photoelectric converters PDa and PDc. FIG. 5 conceptually illustrates a view in which the sensitivity difference between photoelectric converters changes in accordance with the image height when the exit pupil distance 208 relative to the pitch of the micro lens ML viewed in the image height direction (horizontal direction in this example) is shorter than that in the case where the above particular condition is satisfied. Note that the exit pupil distance 208 and a horizontal image height 209 of the image capturing lens are factors for a change in the center position of the exit pupil image 207, and a pupil diameter 210 of the image capturing lens is a factor for a change in the diameter of the exit pupil image 207. The amount of a sensitivity difference between the photoelectric converter PDa and the photoelectric converter PDc is determined by the center position and the diameter of the exit pupil image 207.

Figure 6:
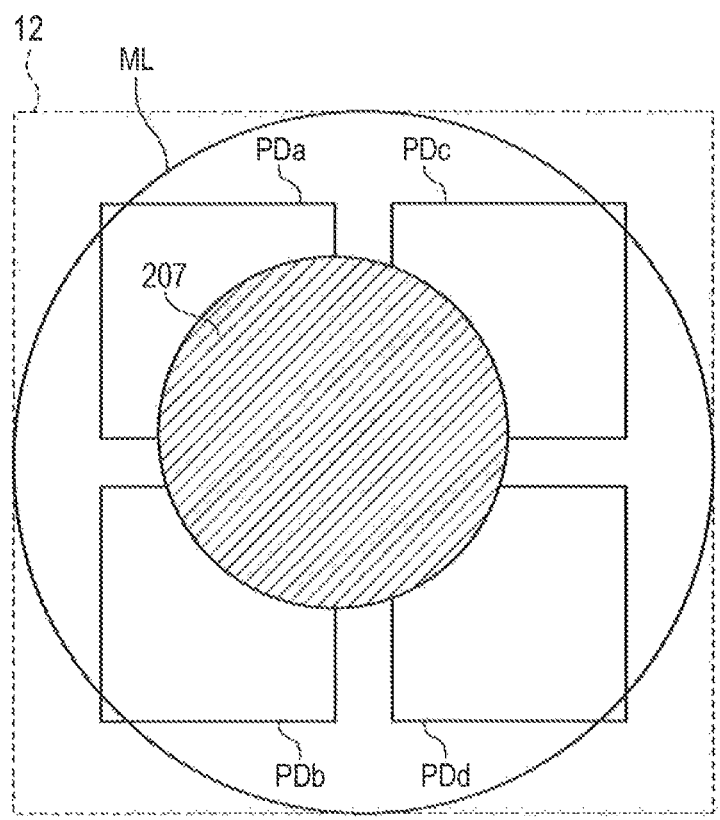
FIG. 6 is a plan view illustrating an example of a relationship of a pixel and an exit pupil image.

FIG. 6 is a plan view illustrating an example of the relationship of the pixel 12 and the exit pupil image 207. The positional relationship of the pixel 12 and the exit pupil image 207 changes in accordance with the position of the pixel 12 relative to the optical axis center of the image capturing lens, as described above. For example, when the exit pupil distance 208 relative to the pitch of the micro lens ML is shorter as illustrated in FIG. 5, the exit pupil image 207 is shifted in the left-upper direction from the center of the pixel 12 as illustrated in FIG. 6 in the pixel 12 having a high image height in the left-under direction viewed from the image capturing lens. The left-under direction viewed from the image capturing lens refers to a direction in which both the H address and the V address are small relative to the optical axis center of the image capturing lens.

In the pixel 12 illustrated in FIG. 6, since the Sd-signal has a relatively lower sensitivity than the Sa-signal, the Sb-signal, and the Sc-signal, the Sd-signal is relatively less useful than other signals. Accordingly, readout of the Sd-signal is performed at the same time as readout of the Sb-signal or the Sc-signal to suppress reduction in framerate. Determination as to which of the Sb-signal and the Sc-signal the Sd-signal is read out with at the same time is preferably made in accordance with the direction of a higher subject contrast. Specifically, it is preferable to read out signals of two photoelectric converters PD at the same time which are arranged in the direction closer to a direction orthogonal to the direction of a higher subject contrast.

For example, with respect to a subject of a relatively higher contrast in the horizontal direction, the Sc-signal and the Sd-signal are read out at the same time from the photoelectric converters PDc and PDd located in the vertical direction. This is because a good S/N ratio can be obtained by using the (Sa+Sb)-signal and the (Sc+Sd)-signal for phase difference detection in the horizontal direction. Further, the Sa-signal and the Sb-signal are preferably used for phase difference detection in the vertical direction. In this case, since the Sd-signal having a relatively lower sensitivity is not included in signals used for phase difference detection, a good S/N ratio is obtained.

In contrast, with respect to a subject of a relatively higher contrast in the vertical direction, the Sb-signal and the Sd-signal are read out at the same time from the photoelectric converters PDb and PDd located in the horizontal direction. This is because a good S/N ratio can be obtained by using the (Sa+Sd)-signal and the (Sb+Sc)-signal for phase difference detection in the vertical direction in this case. Further, the Sa-signal and the Sc-signal are preferably used for phase difference detection in the vertical direction. In this case, since the Sd-signal having a relatively lower sensitivity is not included in signals used for phase difference detection, a good S/N ratio is obtained.

Table 1 lists suitable combinations of signals used for phase difference detection in accordance with the exit pupil distance of the image capturing lens, the image height of the imaging element, and the subject contrast.

TABLE 1

| Exit pupil distance of image capturing lens | Image height of imaging element | Contrast of subject | Phase difference detection in horizontal direction | Phase difference detection in vertical direction |
|---|---|---|---|---|
| Short | left-upper | horizontal | Sa + Sb vs Sc + Sd | Sa vs Sb |
|  |  | vertical | Sa vs Sc | Sa + Sc vs Sb + Sd |
|  | left-under | horizontal | Sa + Sb vs Sc + Sd | Sa vs Sb |
|  |  | vertical | Sb vs Sd | Sa + Sc vs Sb + Sd |
|  | right-upper | horizontal | Sa + Sb vs Sc + Sd | Sc vs Sd |
|  |  | vertical | Sa vs Sc | Sa + Sc vs Sb + Sd |
|  | right-under | horizontal | Sa + Sb vs Sc + Sd | Sc vs Sd |
|  |  | vertical | Sb vs Sd | Sa + Sc vs Sb + Sd |
| Long | left-upper | horizontal | Sa + Sb vs Sc + Sd | Sc vs Sd |
|  |  | vertical | Sb vs Sd | Sa + Sc vs Sb + Sd |
|  | left-under | horizontal | Sa + Sb vs Sc + Sd | Sc vs Sd |
|  |  | vertical | Sa vs Sc | Sa + Sc vs Sb + Sd |
|  | right-upper | horizontal | Sa + Sb vs Sc + Sd | Sa vs Sb |
|  |  | vertical | Sb vs Sd | Sa + Sc vs Sb + Sd |
|  | right-under | horizortal | Sa + Sb vs Sc + Sd | Sa vs Sb |
|  |  | vertical | Sa vs Sc | Sa + Sc vs Sb + Sd |

In Table 1, "exit pupil distance of image capturing lens" corresponds to the exit pupil distance 208 in FIG. 5. This means that a readout condition is changed in accordance with whether the exit pupil distance of the image capturing lens is longer or shorter than the optimum distance relative to the pitch of the micro lens ML as a reference, that is, a predetermined distance where the exit pupil image 207 is not displaced from the center of the pixel 12 in accordance with an image height. In Table 1, the expression "short" represents a case where the focus detection distance is less than the predetermined distance, and the expression "long" represents a case where the focus detection distance is greater than or equal to the predetermined distance.

Further, in Table 1, the expression "image height of imaging element" represents the position of the pixel with reference to the optical center of the image capturing lens when viewed from the image capturing lens side. The expression "contrast of subject" represents the direction of a high contrast of a subject with respect to the horizontal and vertical directions of the imaging element. The expressions "phase difference detection in horizontal direction" and "phase difference detection in vertical direction" represent a pair of signals used for phase difference detection. For example, the expression "Sa+Sb vs Sc+Sd" means that the (Sa+Sb)-signal and the (Sc+Sd)-signal are used as signals used for phase difference detection. Also, the expression "Sa vs Sc" means that the Sa-signal and the Sc-signal are used as signals used for phase difference detection.

Figure 7A:
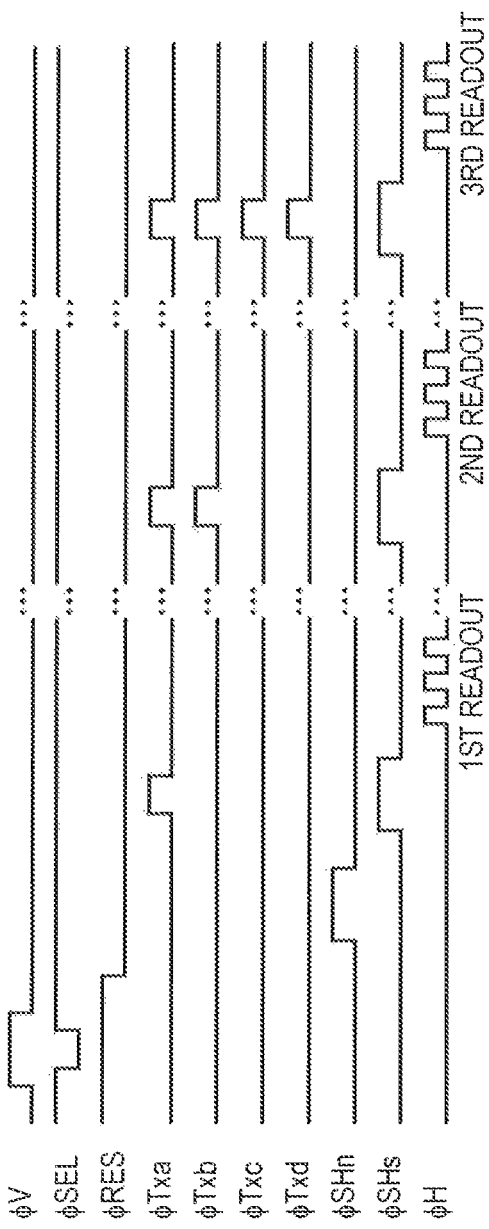
FIG. 7A and FIG. 7B are timing diagrams illustrating a readout method of the solid-state imaging device according to the first embodiment of the present invention.
Figure 7B:
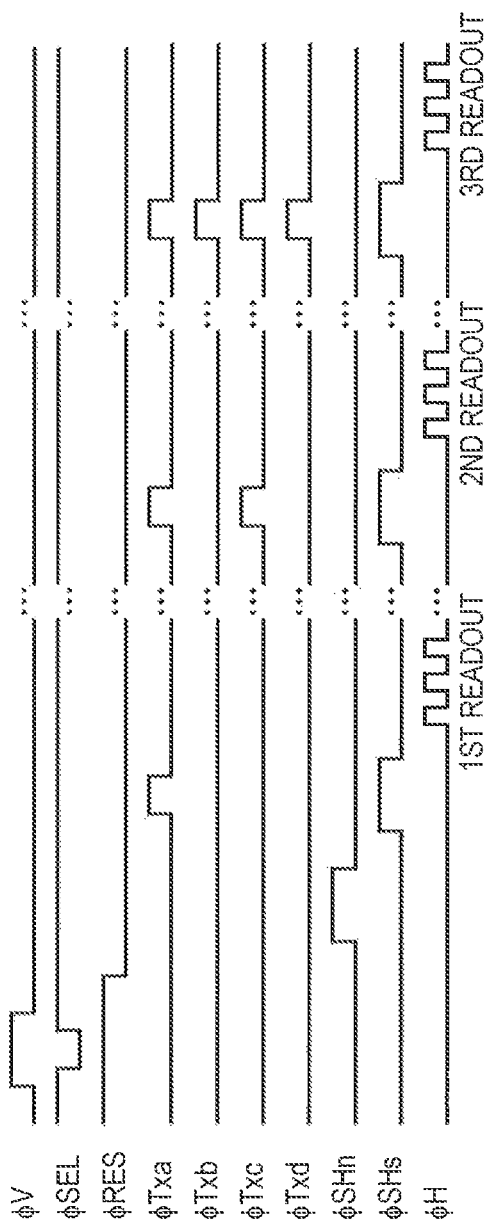

FIG. 7A and FIG. 7B are timing diagrams illustrating the readout method of the solid-state imaging device according to the present embodiment. FIG. 7A is a timing diagram illustrating a readout operation in the pixel 12 corresponding to FIG. 6 (image height is "left-upper") when the contrast of a subject is higher in the horizontal direction. FIG. 7B is a timing diagram illustrating a readout operation in the pixel 12 corresponding to FIG. 6 when the contrast of a subject is higher in the vertical direction. Each signal illustrated in FIG. 7A and FIG. 7B is the same as that in FIG. 4.

When a subject having a higher contrast in the horizontal direction is captured in a capturing condition where the exit pupil distance 208 relative to the pitch of the micro lens ML is short, readout of signals is performed in accordance with the timing chart illustrated in FIG. 7A.

First, the control signal φSEL is controlled to a high level at a predetermined timing in accordance with vertical scanning signal φV to turn on the select transistor M4. At this time, the control signal φRES is at a high level, and the floating diffusion FD has been reset. After the control signal φRES is turned to a low level, the control signal φSHn is controlled to a high level, and thereby a reset signal output to the output line 16 via the select transistor M4 (N-signal) is held in the sample and hold capacitor used for N-signal.

Next, the control signal φTxa is controlled to a high level, and signal charges accumulated in the photoelectric converter PDa are transferred to the floating diffusion FD. At this time, the control signal φSHs is controlled to a high level, and thereby an optical signal output to the output line 16 via the select transistor M4 (S-signal) is held in the sample and hold capacitor used for S-signal. In this example, a signal component based on signal charges accumulated in the photoelectric converter PDa is referred to as an Sa-signal. Next, the horizontal transfer signal φH is turned on sequentially on a column-by-column basis, and the Sa-signal and the N-signal held in the sample and hold capacitor are transferred to the output circuit 50. The difference between the Sa-signal and the N-signal ((Sa−N)-signal) is calculated in the output circuit 50 to output a pixel signal having a good S/N ratio (first readout).

Next, the control signals φTxa and φTxb are controlled to a high level, and signal charges accumulated in the photoelectric converters PDa and PDb are transferred to the floating diffusion FD and added to the signal charges held by the floating diffusion FD. At this time, the control signal φSHs is controlled to a high level, and thereby an optical signal output to the output line 16 via the select transistor M4 (S-signal) is held in the sample and hold capacitor used for S-signal. A signal component based on signal charges accumulated in the photoelectric converter PDb is referred to as an Sb-signal, and an (Sa+Sb)-signal obtained by adding the Sa-signal and the Sb-signal is held in the sample and hold capacitor used for S-signal. Next, the horizontal transfer signal φH is turned on sequentially on a column-by-column basis, and the (Sa+Sb)-signal and the N-signal held in the sample and hold capacitor are transferred to the output circuit 50. The difference between the (Sa+Sb)-signal and the N-signal ((Sa+Sb−N)-signal) is calculated in the output circuit 50 to output a pixel signal having a good S/N ratio (second readout).

Next, the control signals φTxa, φTxb, φTxc, and φTxd are controlled to a high level, and signal charges accumulated in the photoelectric converters PDa, PDb, PDc, PDd are transferred to the floating diffusion FD and added to the signal charges held by the floating diffusion FD. At this time, the control signal φSHs is controlled to a high level, and thereby an optical signal output to the output line 16 via the select transistor M4 (S-signal) is held in the sample and hold capacitor used for S-signal. A signal component based on signal charges accumulated in the photoelectric converter PDc is referred to as an Sc-signal, a signal component based on signal charges accumulated in the photoelectric converter PDd is referred to as an Sd-signal, and an (Sa+Sb+Sc+Sd)-signal obtained by adding the Sa-signal, the Sb-signal, the Sc-signal, and the Sd-signal is held in the sample and hold capacitor used for S-signal. Next, the horizontal transfer signal φH is turned on sequentially on a column-by-column basis, and the (Sa+Sb+Sc+Sd)-signal and the N-signal held in the sample and hold capacitor are transferred to the output circuit 50. The difference between the (Sa+Sb+Sc+Sd)-signal and the N-signal ((Sa+Sb+Sc+Sd−N)-signal) is calculated in the output circuit 50 to output a pixel signal having a good S/N ratio (third readout).

As discussed above, the column readout circuit 30 is configured to read out the signal based on charges generated by only one photoelectric converter PD ((Sa−N)-signal) from each of the plurality of pixels 12. Further, the column readout circuit 30 is configured to read out a plurality of signals including signals based on charges generated in two or more photoelectric converters ((Sa+Sb−N)-signal and (Sa+Sb+Sc+Sd−N)-signal).

The (Sa+Sb+Sc+Sd−N)-signal obtained in such a way can be used as an imaging signal. Further, the (Sc+Sd)-signal can be calculated from the difference between the (Sa+Sb+Sc+Sd−N)-signal and the (Sa+Sb−N)-signal. Thereby, the (Sa+Sb)-signal and the (Sc+Sd)-signal can be used as phase difference signals used for phase difference detection in the horizontal direction. Further, the Sb-signal can be calculated from the difference between the (Sa+Sb−N)-signal and the (Sa−N)-signal. Thereby, the Sa-signal and the Sb-signal can be used as a pair of phase difference signals used for phase difference detection in the vertical direction. That is, the (Sa−N)-signal, the (Sa+Sb−N)-signal, and the (Sa+Sb+Sc+Sd−N)-signal output from the solid-state imaging device are signals that can identify phase difference information.

When a subject having a higher contrast in the vertical direction is captured in a capturing condition where the exit pupil distance 208 relative to the pitch of the micro lens ML is short, readout of signals is performed in accordance with the timing chart illustrated in FIG. 7B.

First, the control signal φSEL is controlled to a high level at a predetermined timing in accordance with the vertical scanning signal φV to turn on the select transistor M4. At this time, the control signal φRES is at a high level, and the floating diffusion FD is already reset. After the control signal φRES is turned to a low level, the control signal φSHn is controlled to a high level, and thereby a reset signal output to the output line 16 via the select transistor M4 (N-signal) is held in the sample and hold capacitor used for N-signal.

Next, the control signal φTxa is controlled to a high level, and signal charges accumulated in the photoelectric converter PDa are transferred to the floating diffusion FD. At this time, the control signal φSHs is controlled to a high level, and thereby an optical signal output to the output line 16 via the select transistor M4 (S-signal) is held in the sample and hold capacitor used for S-signal. In this example, a signal component based on signal charges accumulated in the photoelectric converter PDa is referred to as an Sa-signal. Next, the horizontal transfer signal φH is turned on sequentially on a column-by-column basis, and the Sa-signal and the N-signal held in the sample and hold capacitor are transferred to the output circuit 50. The difference between the Sa-signal and the N-signal ((Sa−N)-signal) is calculated in the output circuit 50 to output a pixel signal having a good S/N ratio (first readout).

Next, the control signals φTxa and φTxc are controlled to a high level, and signal charges accumulated in the photoelectric converters PDa and PDc are transferred to the floating diffusion FD and added to the signal charges held by the floating diffusion FD. At this time, the control signal φSHs is controlled to a high level, and thereby an optical signal output to the output line 16 via the select transistor M4 (S-signal) is held in the sample and hold capacitor used for S-signal. A signal component based on signal charges accumulated in the photoelectric converter PDc is referred to as an Sc-signal, and an (Sa+Sc)-signal obtained by adding the Sa-signal and the Sc-signal is held in the sample and hold capacitor used for S-signal. Next, the horizontal transfer signal φH is turned on sequentially on a column-by-column basis, and the (Sa+Sc)-signal and the N-signal held in the sample and hold capacitor are transferred to the output circuit 50. The difference between the (Sa+Sc)-signal and the N-signal ((Sa+Sc−N)-signal) is calculated in the output circuit 50 to output a pixel signal having a good S/N ratio (second readout).

Next, the control signals φTxa, φTxb, φTxc, and φTxd are controlled to a high level, and signal charges accumulated in the photoelectric converters PDa, PDb, PDc, and PDd are transferred to the floating diffusion FD and added to the signal charges held by the floating diffusion FD. At this time, the control signal φSHs is controlled to a high level, and thereby an optical signal output to the output line 16 via the select transistor M4 (S-signal) is held in the sample and hold capacitor used for S-signal. A signal component based on signal charges accumulated in the photoelectric converter PDb is referred to as an Sb-signal, a signal component based on signal charges accumulated in the photoelectric converter PDd is referred to as an Sd-signal, and an (Sa+Sb+Sc+Sd)-signal obtained by adding the Sa-signal, the Sb-signal, the Sc-signal, and the Sd-signal is held in the sample and hold capacitor used for S-signal. Next, the horizontal transfer signal φH is turned on sequentially on a column-by-column basis, and the (Sa+Sb+Sc+Sd)-signal and the N-signal held in the sample and hold capacitor are transferred to the output circuit 50. The difference between the (Sa+Sb+Sc+Sd)-signal and the N-signal ((Sa+Sb+Sc+Sd−N)-signal) is calculated in the output circuit 50 to output a pixel signal having a good S/N ratio (third readout).

The (Sa+Sb+Sc+Sd−N)-signal obtained in such a way can be used as an imaging signal. Further, the Sc-signal can be calculated from the difference between the (Sa+Sc−N)-signal and the (Sa−N)-signal. Thereby, the Sa-signal and the Sc-signal can be used as a pair of phase difference signals used for phase difference detection in the horizontal direction. Further, an (Sb+Sd)-signal can be calculated from the difference between the (Sa+Sb+Sc+Sd−N)-signal and the (Sa+Sc−N)-signal. Thereby, the (Sa+Sc)-signal and the (Sb+Sd)-signal can be used as a pair of phase difference signals used for phase difference detection in the vertical direction. That is, the (Sa−N)-signal, the (Sa+Sc−N)-signal, and the (Sa+Sb+Sc+Sd−N)-signal output from the solid-state imaging device are signals that can identify phase difference information.

Note that, while three types of signals, namely, the Sa-signal, the (Sa+Sb)-signal or the (Sa+Sc)-signal, and the (Sa+Sb+Sc+Sd)-signal are read out in this example, the combination of readout signals used for acquiring phase difference signals is not limited thereto. For example, it is also possible to acquire phase difference signals in two directions by reading out three types of signals that are the (Sc+Sd)-signal, the (Sa+Sc+Sd)-signal, and the (Sa+Sb+Sc+Sd)-signal. That is, the Sa-signal, which is calculated from the (Sc+Sd)-signal and the (Sa+Sc+Sd)-signal, and the Sb-signal, which is calculated from the (Sa+Sc+Sd)-signal and the (Sa+Sb+Sc+Sd)-signal, can be used as a pair of phase difference signals used for phase difference detection in the vertical direction. Also, the (Sa+Sb)-signal which is calculated from the Sa-signal and the Sb-signal, and the (Sc+Sd) signal can be used for a pair of phase difference signals used for phase difference detection in the horizontal direction.

As discussed above, the configuration of reading out a signal of a pixel having a relatively lower sensitivity (Sd-signal) at the same time as other signals enables an imaging signal and phase difference detection signals to be acquired by three times in total of readout operations (first to third readout). Thereby, the readout time per row can be reduced compared to the readout method illustrated in FIG. 4, and the framerate can be improved. Further, since the phase difference detection in the horizontal direction and the vertical direction is possible on all the rows, reduction in spatial resolution of ranging information can be prevented. Therefore, according to the drive method of the present embodiment, it is possible to achieve both prevention of reduction in framerate and prevention of reduction in spatial resolution of ranging information.

As described above, according to the present embodiment, both the prevention of reduction in framerate and the prevention of reduction in spatial resolution of ranging information can be achieved in a solid-state imaging device having a function of outputting phase difference detection signals.

Second Embodiment

In the readout method for the solid-state imaging device according to the first embodiment, some of signals (Sa-signal, Sb-signal, Sc-signal, Sd-signal) based on charges generated by the photoelectric converters PDa, PDb, PDc, and PDd in terms of preventing reduction in framerate are added and read out. In some capturing condition, however, it is expected that the framerate is not affected even if the readout method according to the reference example illustrated in FIG. 4 is applied. In such a case, it is not necessarily required to read out added signals based on charges generated in the plurality of photoelectric converters PD.

That is, in a capturing condition where no reduction in framerate occurs even with application of the readout method according to the reference example illustrated in FIG. 4, the readout method illustrated in FIG. 4 is implemented to acquire the Sa-signal, the Sb-signal, the Sc-signal, and the Sd-signal. Signals used for phase difference detection are then suitably combined according to the relationship illustrated in Table 1 in accordance with the position of the pixel 12 relative to the optical axis center of the image capturing lens. With such a configuration, since phase difference detection in the horizontal direction and the vertical direction is possible on all the rows, reduction in spatial resolution of ranging information can be prevented. It is therefore possible to achieve both prevention of reduction in framerate and prevention of reduction in spatial resolution of ranging information.

In a capturing condition where reduction in framerate occurs when the readout method according to the reference example illustrated in FIG. 4 is applied, it is preferable to apply the readout method for the solid-state imaging device according to the first embodiment to suppress influence of reduction in framerate.

Third Embodiment

The first embodiment illustrates the pixel 12 having a single floating diffusion FD common to the plurality of photoelectric converters PDa, PDb, PDc, and PDd, as illustrated in FIG. 3. However, it is not necessarily required that the floating diffusion FD be shared by all the photoelectric converters PD forming the pixel 12.

For example, as illustrated in FIG. 8A, a plurality of floating diffusions FDa, FDb, FDc, and FDd corresponding to the plurality of photoelectric converters PDa, PDb, PDc, and PDd, respectively, may be provided. Alternatively, as illustrated in FIG. 8B, a plurality of photoelectric converters PD included in a single pixel 12 may be divided into a plurality of groups, and each floating diffusion FD may be provided to each of the groups. FIG. 8B illustrates an example in which a floating diffusion FDab shared by the photoelectric converters PDa and PDb and a floating diffusion FDcd shared by the photoelectric converters PDc and PDd are provided. In any cases, the in-pixel readout circuit formed of the reset transistor M2, the amplifier transistor M3, and the select transistor M4 may be shared by a plurality of floating diffusions FD or may be provided on a floating diffusion FD basis.

Fourth Embodiment

Figure 9:
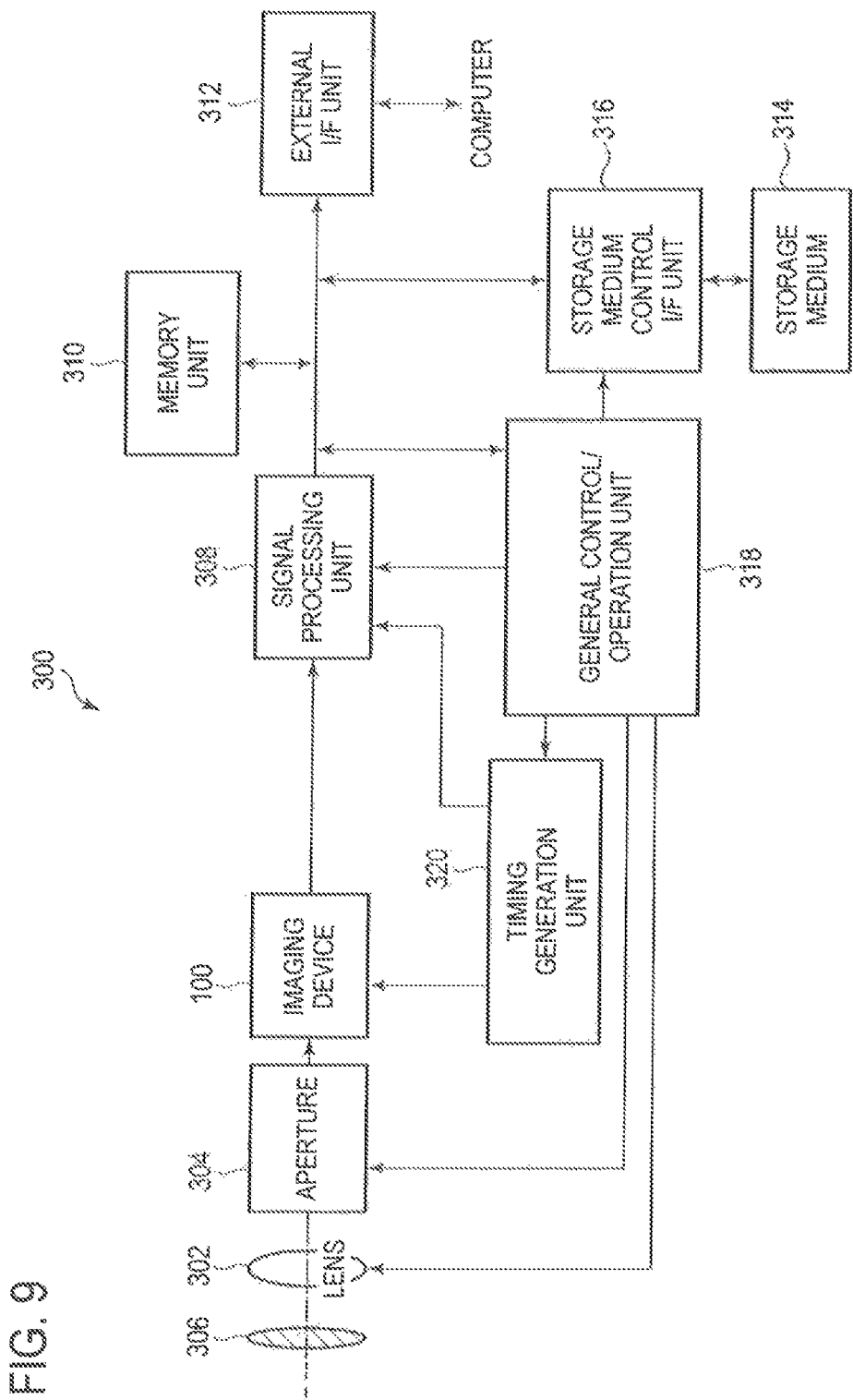
FIG. 9 is a block diagram illustrating a general configuration of an imaging system according to a fourth embodiment of the present invention.

An imaging system according to a fourth embodiment of the present invention will be described with reference to FIG. 9. FIG. 9 is a block diagram illustrating a general configuration of an imaging system according to the present embodiment.

An imaging system 300 of the present embodiment includes an imaging device 301 to which the configuration of the solid-state imaging device 100 of any of the embodiments described above is applied. A specific example of the imaging system 300 may be a digital still camera, a digital camcorder, a surveillance camera, or the like. FIG. 9 illustrates a configuration example of a digital still camera to which a solid-state imaging device 100 of any of the first to third embodiments is applied as the imaging device 301.

The imaging system 300 illustrated as an example in FIG. 9 includes the imaging device 301, a lens 302 that captures an optical image of a subject onto the imaging device 301, an aperture 304 for changing a light amount passing through the lens 302, and a barrier 306 for protecting the lens 302. The lens 302 and the aperture 304 form an optical system that converges a light onto the imaging device 301.

The imaging system 300 further includes a signal processing unit 308 that processes an output signal output from the imaging device 301. The signal processing unit 308 performs an operation of signal processing for performing various correction and compression on an input signal, if necessary, to output the signal. For example, the signal processing unit 308 performs on an input signal, predetermined image processing such as a conversion process of converting pixel output signals of RGB to Y, Cb, Cr color space, gamma correction, or the like. Further, the signal processing unit 308 may have a phase difference calculation unit that calculates a phase difference based on phase difference detection signals output from the imaging device 301.

The imaging system 300 further includes a memory unit 310 for temporarily storing image data therein and an external interface unit (external I/F unit) 312 for communicating with an external computer or the like. The imaging system 300 further includes a storage medium 314 such as a semiconductor memory used for performing storage or readout of imaging data and a storage medium control interface unit (storage medium control I/F unit) 316 used for performing storage or readout on the storage medium 314. Note that the storage medium 314 may be embedded in the imaging system 300 or may be removable.

The imaging system 300 further includes a general control/operation unit 318 that performs various computation and controls the entire digital still camera and a timing generation unit 320 that outputs various timing signals to the imaging device 301 and the signal processing unit 308. The timing signal or the like may be externally input, and the imaging system 300 may have at least the imaging device 301 and the signal processing unit 308 that processes an output signal output from the imaging device 301. The general control/operation unit 318 and the timing generation unit 320 may be configured to perform some or all of control functions of the imaging device 301.

The imaging device 301 outputs an image signal to the signal processing unit 308. The signal processing unit 308 performs predetermined signal processing on an imaging signal from the imaging device 301 and outputs image data. Further, the signal processing unit 308 generates an image by using the image signals. The image generated in the signal processing unit 308 is stored in the storage medium 314, for example. Further, the image generated in the signal processing unit 308 is displayed as a moving image or a static image on a monitor formed of a liquid crystal display or the like. An image stored in the storage medium 314 can be hard-copied by a printer or the like.

The imaging device 301 also outputs phase difference detection signals based on signals output by the pixel 12 to the signal processing unit 308. The phase difference calculation unit of the signal processing unit 308 calculates a phase difference between two images based on the phase difference detection signals and detects whether or not a subjected is focused. When the signal processing unit 308 detects that it is not in a focused state, the general control/operation unit 318 drives the optical system in a focusing direction. The signal processing unit 308 again uses phase difference detection signals output from the imaging device 301 to again detect whether or not it is in a focused state. Subsequently, the imaging device 301, the signal processing unit 318, and the general control/operation unit 308 repeat this operation until a focused stats is obtained.

Note that the function of the signal processing unit 308 may be implemented by a signal processing device different from the imaging device 301. Further, the imaging device 301 may have the function of the signal processing unit 308.

By forming an imaging system using the solid-state imaging device of each of the embodiments described above, it is possible to increase focus detection accuracy on a subject and realize an imaging system capable of acquiring a higher quality image.

Fifth Embodiment

Figure 10A:
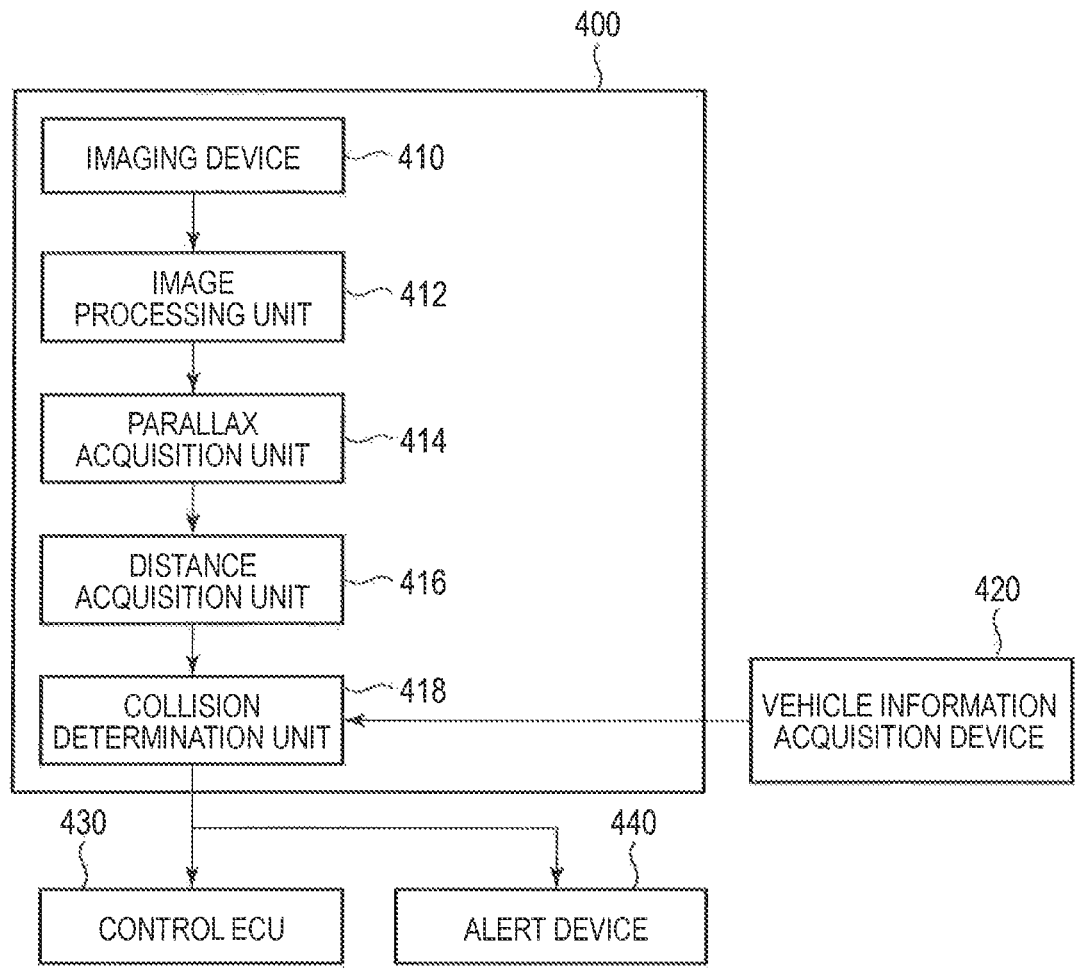
FIG. 10A is a diagram illustrating a configuration example of an imaging system according to a fifth embodiment of the present invention.
Figure 10B:
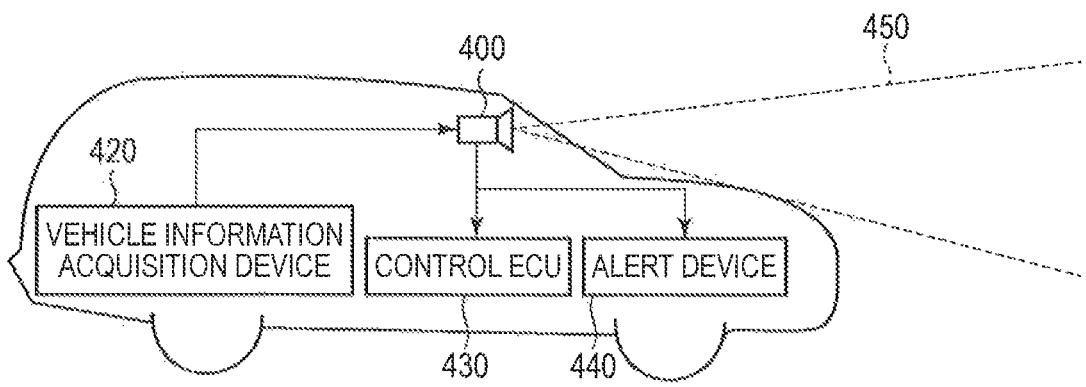
FIG. 10B is a diagram illustrating a configuration example of a movable object according to the fifth embodiment of the present invention.

An imaging system and a movable object according to a fifth embodiment of the present invention will be described by using FIG. 10A and FIG. 10B. FIG. 10A is a diagram illustrating a configuration of an imaging system according to the present embodiment. FIG. 10B is a diagram illustrating a configuration example of a movable object according to the present embodiment.

FIG. 10A illustrates an example of an imaging system 400 related to an on-vehicle camera. The imaging system 400 includes an imaging device 410. The imaging device 410 is any of the solid-state imaging devices 100 described in any of the first to third embodiments. The imaging system 400 includes an image processing unit 412 that performs image processing on a plurality of image data acquired by the imaging device 410 and a parallax acquisition unit 414 that calculates a parallax (a phase difference of parallax images) from the plurality of image data acquired by the imaging device 410. Further, the imaging system 400 includes a distance acquisition unit 416 that calculates a distance to an object based on the calculated parallax and a collision determination unit 418 that determines whether or not there is a collision possibility based on the calculated distance. Here, the parallax acquisition unit 414 and the distance acquisition unit 416 are an example of a distance information acquisition unit that acquires distance information on the distance to an object. That is, the distance information is information on a parallax, a defocus amount, a distance to an object, or the like. The collision determination unit 418 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by a combination thereof.

The imaging system 400 is connected to a vehicle information acquisition device 420 and can acquire vehicle information such as a vehicle speed, a yaw rate, a steering angle, or the like. Further, the imaging system 400 is connected to a control ECU 430, which is a control device that outputs a control signal for causing a vehicle to generate braking force based on a determination result by the collision determination unit 418. That is, the control ECU 430 is an example of a movable object control unit for controlling a movable object based on the distance information. Further, the imaging system 400 is also connected to an alert device 440 that issues an alert to the driver based on a determination result by the collision determination unit 418. For example, when the collision probability is high as the determination result of the collision determination unit 418, the control ECU 430 performs vehicle control to avoid a collision or reduce damage by applying a brake, pushing back an accelerator, suppressing engine power, or the like. The alert device 440 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 400. FIG. 10B illustrates the imaging system 400 in a case of capturing a front area of a vehicle (a capturing region 450). The vehicle information acquisition device 420 transmits instructions to cause the imaging system 400 to operate and perform capturing. The use of the solid-state imaging device 100 of the first embodiment as the imaging device 410 enables the imaging system 400 of the present embodiment to further improve the ranging accuracy.

Although an example of control for avoiding a collision to another vehicle has been described in the description above, it is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

For example, while the case where each of the pixels 12 includes the four photoelectric converters PDa, PDb, PDc, and PDd arranged in a matrix of two rows by two columns has been described as an example in the above embodiments, the pixel 12 is not necessarily required to have four photoelectric converters. The pixel 12 includes preferably three or more photoelectric converters PD for acquiring phase difference information in two directions and thus may have three photoelectric converters PD or may have five or more photoelectric converters PD.

Further, the imaging systems illustrated in the fourth and fifth embodiments are examples of an imaging system to which the solid-state imaging device of the present invention may be applied, the imaging system to which the solid-state imaging device of the present invention can be applied is not limited to the configuration illustrated in FIG. 9 and FIG. 10A.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiments) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-231686, filed Dec. 1, 2017 which is hereby incorporated by reference herein in its entirety.

What is claimed is:

1. A solid-state imaging device comprising:
a plurality of pixels arranged to form a plurality of rows and a plurality of columns; and
a readout circuit that reads out signals from an associated pixel of the plurality of pixels,
wherein each of the plurality of pixels includes a first photoelectric converter, a second photoelectric converter arranged in a first direction with respect to the first photoelectric converter, a third photoelectric converter arranged in a second direction intersecting with the first direction with respect to the first photoelectric converter, a fourth photoelectric converter arranged in the second direction with respect to the second photoelectric converter and in the first direction with respect to the third photoelectric converter, and a single micro lens that converges light to the first to fourth photoelectric converters,
wherein
the readout circuit is configured to read out a plurality of signals from the associated pixel by three times of readout operations,
within the three times of readout operations, charges from all of the first to fourth photoelectric converters of the associated pixel are read out so that the charges of each of the first to fourth photoelectric converters are reflected to at least one of the plurality of signals,
the readout circuit is configured to read out the plurality of signals from the associated pixel so as to be able to identify a signal based on charges generated by only one photoelectric converter out of the first to fourth photoelectric converters of the associated pixel, and
the readout circuit is configured to select the one photoelectric converter of the associated pixel out of the first to fourth photoelectric converters.

2. The solid-state imaging device according to claim 1, wherein the signal based on charges generated by only the one photoelectric converter is a signal by which phase difference information in the second direction or the first direction can be identified.

3. The solid-state imaging device according to claim 1, wherein a signal based on charges generated by two photoelectric converters can be identified by using the plurality of signals.

4. The solid-state imaging device according to claim 3, wherein the signal based on charges generated by two photoelectric converters is a signal by which phase difference information in the first direction or the second direction can be identified.

5. The solid-stale imaging device according to claim 1, wherein the plurality of signals includes a signal based on charges generated by the first to fourth photoelectric converters included in the associated pixel.

6. The solid-state imaging device according to claim 1, wherein the readout circuit is configured to read out from the associated pixel, a first signal based on charges generated by the first photoelectric converter, a second signal based on charges generated by the first and second photoelectric converters, and a third signal based on charges generated by the first to fourth photoelectric converters.

7. The solid-state imaging device according to claim 1, wherein the readout circuit is configured to read out, from the associated pixel, a first signal based on charges generated by the first photoelectric converter, a second signal based on charges generated by the first third, and fourth photoelectric converters, and a third signal based on charges generated by the first to fourth photoelectric converters.

8. The solid-state imaging device according to claim 1, wherein the readout circuit is configured to read out, from the associated pixel, a first signal based on charges generated by the third and fourth photoelectric converters, a second signal based on charges generated by the first, third, and fourth photoelectric converters, and a third signal based on charges generated by the first to fourth photoelectric converters.

9. The solid-state imaging device according to claim 1, wherein the readout circuit selects the one photoelectric converter of the associated pixel out of the first to fourth photoelectric converters in accordance with an exit pupil distance of an image capturing lens.

10. The solid-state imaging device according to claim 9, wherein the readout circuit selects, as the one photoelectric converter, a photoelectric converter which is the closest to the optical center of the linage capturing lens out of the first to fourth photoelectric converters when the exit pupil distance is greater than or equal to a predetermined distance.

11. The solid-state imaging device according to claim 9, wherein the readout circuit selects, as the one photoelectric converter, a photoelectric converter which is the farthest from the optical center of the image capturing lens out of the first to fourth photoelectric converters when the exit pupil distance is less than a predetermined distance.

12. The solid-state imaging device according to claim 1, wherein the first direction is closer to a direction orthogonal to a direction of a high contrast of a subject than the second direction.

13. A signal processing device that processes signals output from a solid-state imaging device that includes a plurality of pixels arranged to form a plurality of rows and a plurality of columns, wherein each of the plurality of pixels includes a plurality of photoelectric converters, which include three or more photoelectric converters, and a single micro lens that converges light to the plurality of photoelectric converters, the signal processing device comprising:
a phase difference calculation unit that calculates a phase difference in a first direction based on a pair of first phase difference detection signals including phase difference information in the first direction and calculates a phase difference in a second direction based on a pair of second phase difference detection signals including phase difference information in the second direction, the second direction intersecting with the first direction,
wherein each of the pair of first phase difference detection signals is a signal based on charges generated by only one photoelectric converter of the plurality of photoelectric converters, and
wherein each of the pair of second phase difference detection signals is a signal based on charges generated by two or more photoelectric converters of the plurality of photoelectric converters.

14. The signal processing device according to claim 13, wherein the plurality of photoelectric converters include a first photoelectric converter, a second photoelectric converter arranged in the first direction with respect to the first photoelectric converter, a third photoelectric converter arranged in the second direction with respect to the first photoelectric converter, and a fourth photoelectric converter arranged in the second direction with respect to the second photoelectric converter and in the first direction with respect to the third photoelectric converter,
    wherein the phase difference calculation unit calculates the pair of first phase difference detection signals based on a first signal and a second signal and calculates the pair of second phase difference detection signal based on the second signal and a third signal,
    wherein the first signal is a signal based on charges generated by the first photoelectric converter,
    wherein the second signal is a signal based on charges generated by the first and second photoelectric converters, and
    wherein the third signal is a signal based on charges generated by the first to fourth photoelectric converters.

15. The signal processing device according to claim 13, wherein the plurality of photoelectric converters include a first photoelectric converter, a second photoelectric converter arranged in the first direction with respect to the first photoelectric converter, a third photoelectric converter arranged in the second direction with respect to the first photoelectric converter, and a fourth photoelectric converter arranged in the second direction with respect to the second photoelectric converter and in the first direction with respect to the third photoelectric converter,
    wherein the phase difference calculation unit calculates the pair of first phase difference detection signals based on a first signal, a second signal, and a third signal and calculates the pair of second phase difference detection signal based on the first signal, the second signal, and the third signal,
    wherein the first signal is a signal based on charges generated by the first photoelectric converter,
    wherein the second signal is a signal based on charges generated by the first, third, and fourth photoelectric converters, and
    wherein the third signal is a signal based on charges generated by the first to fourth photoelectric converters.

16. The signal processing device according to claim 13, wherein the plurality of photoelectric converters include a first photoelectric converter, a second photoelectric converter arranged in the first direction with respect to the first photoelectric converter, a third photoelectric converter arranged in the second direction with respect to the first photoelectric converter, and a fourth photoelectric converter arranged in the second direction with respect to the second photoelectric converter and in the first direction with respect to the third photoelectric converter,
    wherein the phase difference calculation unit calculates the pair of first phase difference detection signals based on a first signal, a second signal, and a third signal and calculates the pair of second phase difference detection signal based on the second signal and the third signal,
    wherein the first signal is a signal based on charges generated by the third and fourth photoelectric converters,
    wherein the second signal is a signal based on charges generated by the first, third, and fourth photoelectric converters, and
    wherein the third signal is a signal based on charges generated by the first to fourth photoelectric converters.

17. An imaging system comprising:
the solid-state imaging device according to claim 1; and
a signal processing device that processes signals output from the solid-state imaging device,
    wherein the signal processing device calculates a phase difference in the first direction based on a pair of first phase difference detection signals including phase difference information in the first direction and calculates a phase difference in the second direction based on a pair of second phase difference detection signals including phase difference information in the second direction,
    wherein each signal of the pair of first phase difference detection signals is a signal based on charges generated by only one photoelectric converter of the plurality of photoelectric converters, and
    wherein each signal of the pair of second phase difference detection signals is a signal based on charges generated by two or more photoelectric converters of the plurality of photoelectric converters.

18. A movable object comprising:
the solid-state imaging device according to claim 1;
a distance information acquisition unit that acquires distance information on a distance to an object, from a parallax image based on signals output from the pixels of the solid-state imaging device; and
a control unit that controls the movable object based on the distance information.

* * * * *